(12) United States Patent
Fukuma et al.

(10) Patent No.: US 12,002,934 B2
(45) Date of Patent: Jun. 4, 2024

(54) METHOD AND DEVICE FOR DETERMINING STATE OF RECHARGEABLE BATTERY

(71) Applicant: PRIMEARTH EV ENERGY CO., LTD., Kosai (JP)

(72) Inventors: Tamotsu Fukuma, Kosai (JP); Hitoshi Suzuki, Toyohashi (JP); Daisuke Koba, Toyohashi (JP)

(73) Assignee: PRIMEARTH EV ENERGY CO., LTD., Kosai (JP)

( * ) Notice: Subject to any disclaimer, the term of this patent is extended or adjusted under 35 U.S.C. 154(b) by 159 days.

(21) Appl. No.: 17/239,353

(22) Filed: Apr. 23, 2021

(65) Prior Publication Data

US 2021/0336300 A1    Oct. 28, 2021

(30) Foreign Application Priority Data

Apr. 28, 2020 (JP) .................................. 2020-079473

(51) Int. Cl.
*H01M 50/569* (2021.01)
*B60L 58/12* (2019.01)
(Continued)

(52) U.S. Cl.
CPC .......... *H01M 10/484* (2013.01); *B60L 58/12* (2019.02); *G01R 31/3842* (2019.01); *H01M 50/569* (2021.01); *H01M 2220/20* (2013.01)

(58) Field of Classification Search
CPC .......... H01M 10/484; H01M 2220/20; H01M 50/569; G01R 31/382; G01R 31/52; G01R 31/389; Y02T 10/70; Y02E 60/10
See application file for complete search history.

(56) References Cited

U.S. PATENT DOCUMENTS

| 5,990,664 A | * | 11/1999 | Rahman | H02J 7/0063 324/426 |
| 2012/0206107 A1 | * | 8/2012 | Ono | H02J 7/00306 711/E12.001 |

(Continued)

FOREIGN PATENT DOCUMENTS

| JP | 2003045500 A | 2/2003 |
| JP | 2003-123850 A | 4/2003 |

(Continued)

OTHER PUBLICATIONS

Department of the Army Technical Manual, Transiets and waveforms (Year: 1951).*

(Continued)

*Primary Examiner* — Cynthia H Kelly
*Assistant Examiner* — Tarik J Phillip
(74) *Attorney, Agent, or Firm* — Maschoff Brennan

(57) ABSTRACT

A rechargeable battery state determination method determines whether a rechargeable battery is in a micro-short-circuit-prone state, which is a state that is highly likely to form a micro-short circuit. The rechargeable battery state determination method includes measuring an electron transfer resistance of the rechargeable battery by applying a voltage or current having a predetermined or higher frequency to an electrode system of the rechargeable battery, determining whether an inter-electrode distance is satisfactory based on a comparison of the measured electron transfer resistance of the rechargeable battery with a predetermined lower limit threshold value, in which the determining whether an inter-electrode distance is satisfactory including determining that the inter-electrode distance is satisfactory when the measured electron transfer resistance of the rechargeable battery is greater than or equal to the lower limit threshold value, and determining that the rechargeable (Continued)

battery is a conforming piece when the inter-electrode distance is satisfactory.

4 Claims, 6 Drawing Sheets

(51) Int. Cl.
  *G01R 31/3842* (2019.01)
  *H01M 10/48* (2006.01)

(56) References Cited

U.S. PATENT DOCUMENTS

| | | | |
|---|---|---|---|
| 2016/0061907 A1* | 3/2016 | Koba | H01M 10/48 |
| | | | 324/430 |
| 2018/0043778 A1* | 2/2018 | Murbach | G01R 31/389 |
| 2019/0041468 A1 | 2/2019 | Katoh et al. | |
| 2019/0051925 A1 | 2/2019 | Li et al. | |
| 2020/0033414 A1 | 1/2020 | Izumi et al. | |
| 2020/0408844 A1 | 12/2020 | Ogasawara et al. | |

FOREIGN PATENT DOCUMENTS

| | | | |
|---|---|---|---|
| JP | 2005039139 A | | 2/2005 |
| JP | 3677993 B2 | | 8/2005 |
| JP | 2008177008 A | | 7/2008 |
| JP | 2013-246095 A | | 12/2013 |
| JP | 2014-206442 A | | 10/2014 |
| JP | 2015-222195 A | | 12/2015 |
| JP | 2019036391 A | | 3/2019 |
| KR | 20090076679 A | * | 7/2009 |
| WO | 2019/215786 A1 | | 11/2019 |

OTHER PUBLICATIONS

Modified translation of KR20090076679A as taught by Kon et al (Year: 2009).*

Electrical impedance, Britannica, The Editors of Encyclopaedia (Year: 2023).*

JP Office Action dated Jan. 24, 2023 as received in Application No. 2020-079473.

Extended European Search Report dated Oct. 4, 2021 as received in application No. 21169438.5.

* cited by examiner

METHOD AND DEVICE FOR DETERMINING STATE OF RECHARGEABLE BATTERY

BACKGROUND

1. Field

The following description relates to a method and a device for determining a state of a rechargeable battery, more specifically, a method and a device for determining a state of a rechargeable battery with higher accuracy.

2. Description of Related Art

An electrically driven vehicle, which is, for example, an electric car, and a hybrid vehicle, which includes a motor and an engine as drive sources of the vehicle, use a rechargeable battery as a power supply. The rechargeable battery includes, for example, a lithium-ion rechargeable battery and a nickel metal hydride rechargeable battery. Such a rechargeable battery is formed by combining a number of battery cells. During normal manufacturing and handling, a predetermined number of battery cells are used as a single unit to form a battery module. Battery modules are combined to form an assembled battery, and the assembled battery is mounted on a vehicle. Deterioration of an assembled battery progresses to a certain level in accordance with time and use of the assembled battery. However, the battery modules in the assembled battery deteriorate at different progress rates. In such a case, the assembled battery does not demonstrate a specified performance as a whole due to a battery module that has deteriorated.

The rechargeable battery may be collected from the user, and a deterioration state of the rechargeable battery may be determined so that reusable battery modules are selected and combined to form a reformed product of an assembled battery for reuse. In reuse of a rechargeable battery, there is a technique for assessing the deterioration state of the battery and the remaining life of the battery. With such a technique, a future battery state of a battery is assessed without braking the battery. When a battery is determined to be normal, the battery may be reused until the expected life ends.

An example of battery deterioration modes is the formation of a micro-short circuit, that is, a conductive path formed by deposition or incorporation of a conductive substance between a positive electrode and a negative electrode. When determining whether battery modules are usable to reform a rechargeable battery, a battery module that is highly likely to have a micro-short circuit needs to be eliminated, for example, using a process that detects a decrease in circuit voltage OCV (open-circuit-voltage). The determining process measures the circuit voltage OCV to readily detect that a battery module having a greatly decreased voltage is non-conforming. The determining process detects a battery already having a micro-short circuit but cannot detect a sign that a micro-short circuit will be formed in a short time after reformation.

In this regard, Japanese Laid-Open Patent Publication No. 2015-222195 discloses the following invention. First, an alternating current (AC) internal resistance X of a used rechargeable battery, which is subject to determination, is obtained. The obtained value of the AC internal resistance X is compared to an AC internal resistance threshold value X0 of a rechargeable battery that is the same type as the used rechargeable battery. The AC internal resistance threshold value X0 corresponds to a solution content threshold value that is determined in advance for an amount of solution contained in a separator of the rechargeable battery. Based on the comparison result, it is determined whether the used rechargeable battery is usable to reform an assembled battery that includes rechargeable batteries.

In this process, an increase in resistance caused by a decrease in the electrolytic solution is linked with a micro-short circuit, and a sign of the micro-short circuit is detected by detecting an increase in the AC internal resistance X.

The inventors of the present invention have found that a micro-short circuit may be formed even when the electrolytic solution is not decreased, that is, when the AC resistance is not increased.

As described in Patent Document 1, detection of a sign of a micro-short circuit by linking an increase in resistance caused by a decrease in the electrolytic solution with the micro-short circuit is not sufficient to detect the sign of a micro-short circuit.

SUMMARY

It is an objective of the present disclosure to provide a method and device for determining a state of a rechargeable battery with higher accuracy.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present disclosure is a rechargeable battery state determination method that determines whether a rechargeable battery is in a micro-short-circuit-prone state, which is a state that is highly likely to form a micro-short circuit. The rechargeable battery state determination method includes measuring an electron transfer resistance of the rechargeable battery by applying a voltage or current having a predetermined or higher frequency to an electrode system of the rechargeable battery, determining whether an inter-electrode distance is satisfactory based on a comparison of the measured electron transfer resistance of the rechargeable battery with a predetermined lower limit threshold value, in which the determining whether an inter-electrode distance is satisfactory including determining that the inter-electrode distance is satisfactory when the measured electron transfer resistance of the rechargeable battery is greater than or equal to the lower limit threshold value, and determining that the rechargeable battery is a conforming piece when the inter-electrode distance is satisfactory.

The rechargeable battery state determination method further includes determining whether an electrolytic solution is satisfactory based on a comparison of the measured electron transfer resistance of the rechargeable battery with a predetermined upper limit threshold value. The determining whether an electrolytic solution is satisfactory includes determining that the electrolytic solution is satisfactory when the measured electron transfer resistance of the rechargeable battery is less than the predetermined upper limit threshold value. The determining that the rechargeable battery is a conforming piece further includes determining that the rechargeable battery is a conforming piece when the electrolytic solution is satisfactory.

In the rechargeable battery state determination method, the measuring an electron transfer resistance of the rechargeable battery includes outputting a Nyquist plot by applying a voltage or current to the electrode system of the rechargeable battery as a frequency with very small amplitude is changed in a stepped manner to measure impedance spectrum of the rechargeable battery using an alternating current (AC) impedance method.

In the rechargeable battery state determination method, the voltage or current applied to measure the electron transfer resistance of the rechargeable battery has a sine wave or a non-sinusoidal wave including a square wave, a triangle wave, and a sawtooth wave. The term "the AC impedance method" includes a measurement conducted as the frequency is changed using a DC pulse wave such as a square wave, a triangle wave, or a sawtooth wave having a fixed cycle instead of using AC.

In the rechargeable battery state determination method further includes measuring a circuit voltage of the rechargeable battery and determining whether the micro-short circuit is formed base on a comparison of the measured circuit voltage of the rechargeable battery with a predetermined lower limit voltage threshold value. The determining whether the micro-short circuit is formed includes determining that the micro-short circuit is not formed when the measured circuit voltage of the rechargeable battery is greater than or equal to the predetermined lower limit voltage threshold value. The determining that the rechargeable battery is a conforming piece further includes determining that the rechargeable battery is a conforming piece when the micro-short circuit is not formed.

An aspect of the present disclosure is a rechargeable battery state determining device that includes a voltage generator, a voltage application unit, an electron transfer resistance measurement unit, and a controller. The voltage generator generates a voltage or current having a predetermined or higher frequency. The voltage application unit applies the voltage or current to an electrode system of a rechargeable battery. The electron transfer resistance measurement unit measures an electron transfer resistance of the rechargeable battery when the voltage or current is applied to the electrode system of the rechargeable battery. The controller compares the electron transfer resistance with a predetermined lower limit threshold value. When the electron transfer resistance is greater than or equal to the lower limit threshold value, the controller determines that an inter-electrode distance is satisfactory and that the rechargeable battery is a conforming piece.

In the rechargeable battery state determining device, the controller compares the electron transfer resistance measured by the electron transfer resistance measurement unit with a predetermined upper limit threshold value. When the electron transfer resistance is less than the predetermined upper limit threshold value, the controller determines that an electrolytic solution is satisfactory and that the rechargeable battery is a conforming piece.

The rechargeable battery state determining device further includes a voltage measurement unit that measures a circuit voltage when the rechargeable battery is charged under a predetermined condition. The controller compares the circuit voltage of the rechargeable battery measured by the voltage measurement unit with a predetermined lower limit voltage threshold value. When the circuit voltage of the rechargeable battery is greater than or equal to the predetermined lower limit voltage threshold value, the controller determines that the rechargeable battery is a conforming piece.

The rechargeable battery state determining device is arranged on a vehicle on which the rechargeable battery is mounted and determines a state of the rechargeable battery mounted on the vehicle.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

First Embodiment

Overview of Embodiment

In the present embodiment, a method for determining a state of a rechargeable battery 1 and a rechargeable battery state determining device 10 use a technique that estimates an inter-electrode distance D between a positive electrode and a negative electrode to detect a rechargeable battery 1 that is likely to form a micro-short circuit in a short time after shipment.

The rechargeable battery 1 is, for example, a lithium-ion rechargeable battery or a nickel-metal hydride rechargeable battery. In the present embodiment, an on-board lithium-ion rechargeable battery will be described as an example.

Figure 1A:
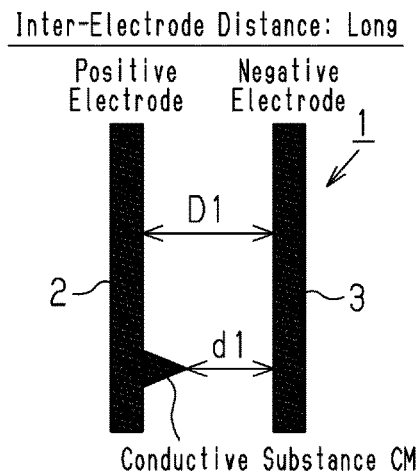
FIG. 1A is a schematic diagram showing an inter-electrode distance D1 between a positive electrode and a negative electrode of a conforming rechargeable battery GP.
Figure 1B:
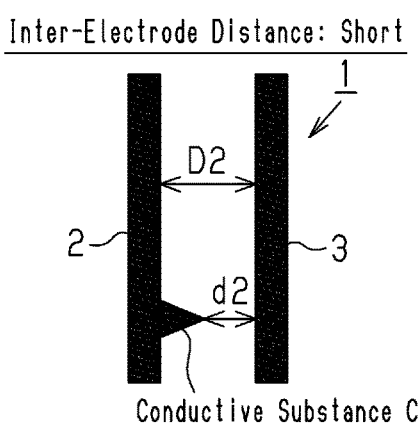
FIG. 1B is a schematic diagram showing an inter-electrode distance D2 between a positive electrode and a negative electrode of a non-conforming rechargeable battery NGP.

FIG. 1A is a schematic diagram showing an inter-electrode distance D1 between a positive electrode 2 and a negative electrode 3 of a rechargeable battery 1 that is a conforming piece GP. FIG. 1B is a schematic diagram showing an inter-electrode distance D2 between a positive electrode 2 and a negative electrode 3 of a rechargeable battery 1 that is a non-conforming piece NGP. Comparison will be described with reference to FIGS. 1A and 1B. FIG. 1A shows a state of the conforming piece GP having no deterioration such as an initial state of the rechargeable battery 1. In FIG. 1A, the inter-electrode distance D between the positive electrode 2 and the negative electrode 3 is D1, which is an appropriate distance. In this case, when metal deposition or contamination forms a conductive substance CM, the inter-electrode distance D between the positive electrode 2 and the negative electrode 3 is decreased from the inter-electrode distance D1 to a remaining distance d1. As shown in FIG. 1B, when the positive electrode 2 expands, for example, due to deterioration of the rechargeable battery 1, the inter-electrode distance D is decreased to D2. In this case, if the same conductive substance CM as the one shown in FIG. 1A is formed, the inter-electrode distance D is decreased from the inter-electrode distance D2 to a remaining distance d2. The decrease rate of the remaining distance d2 to the remaining distance d1 is greater than the decrease rate of the inter-electrode distance D2 to the inter-electrode distance D1.

Figure 2:
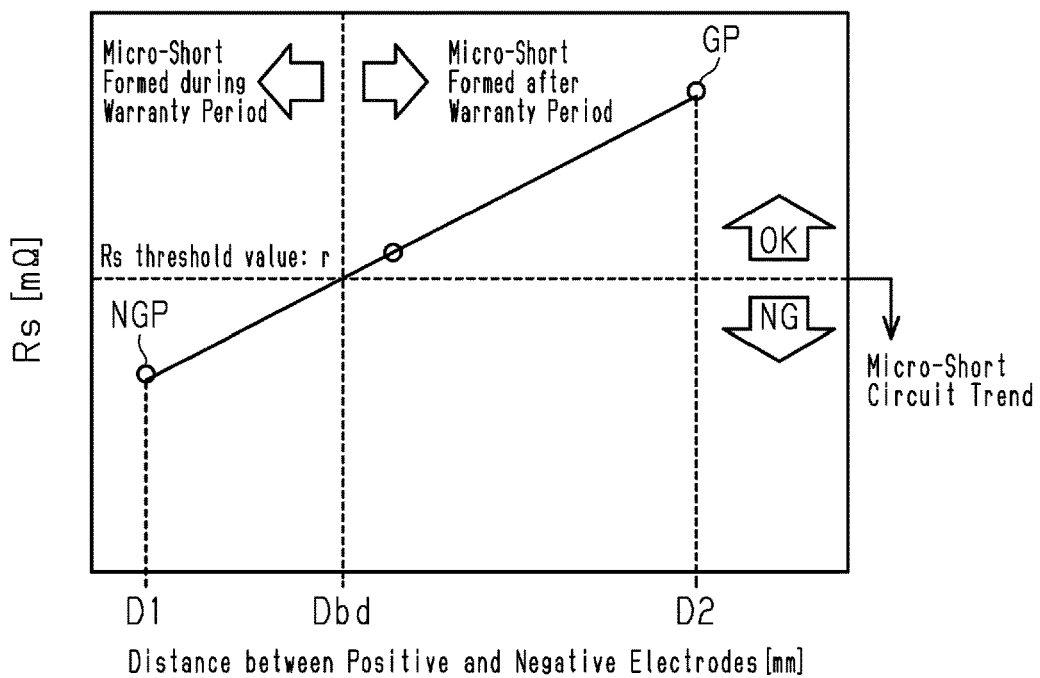
FIG. 2 is a graph showing a relationship between electron transfer resistance Rs and inter-electrode distance between a positive electrode and a negative electrode.

FIG. 2 is a graph showing a relationship between the electron transfer resistance Rs and the inter-electrode distance D between the positive electrode and the negative electrode. The electron transfer resistance Rs, which will be described later, refers to resistance when an AC voltage having a frequency of 100 Hz or higher is applied to the electrode system of the rechargeable battery 1 to transfer electrons through the electrolytic solution, electrode poles, and collector plates. As shown in FIG. 2, the conforming piece GP has a large electron transfer resistance Rs1 corresponding to the long inter-electrode distance D1 of the conforming piece GP. The non-conforming piece NGP has a small electron transfer resistance Rs2 corresponding to the short inter-electrode distance D2 of the non-conforming piece NGP. This allows for estimation of the inter-electrode distance D by measuring the electron transfer resistance Rs.

In the present embodiment, the electron transfer resistance Rs is measured when the inter-electrode distance D is appropriate, and a threshold value r of the electron transfer resistance Rs corresponding to the inter-electrode distance D is set. Then, an electron transfer resistance Rs is measured and compared with the threshold value r of the electron transfer resistance Rs to determine whether the inter-electrode distance D is appropriate. This allows for determination of whether the rechargeable battery 1 is likely to form a micro-short circuit in a short time after shipment.

Measurement of Electron Transfer Resistance Rs

A process for measuring the electron transfer resistance Rs will now be described.

Equivalent Circuit of Rechargeable Battery 1

Figure 3:
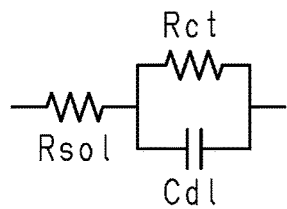
FIG. 3 is an equivalent circuit diagram of a rechargeable battery.

FIG. 3 is a circuit diagram schematically showing an equivalent circuit of the rechargeable battery 1. The rechargeable battery 1 may be expressed by the equivalent circuit shown in FIG. 3. More specifically, the rechargeable battery 1 may be expressed by an equivalent circuit including a solution resistance Rsol and a parallel circuit of an electrical double layer Cdl and a charge transfer resistance Rct connected in series to the solution resistance Rsol. A configuration having an electrolytic solution between electrodes is a concept of the electrical double layer Cdl and is used as a capacitor. The AC resistance of the electrical double layer Cdl is a resistance component corresponding to dielectric loss due to delay of polarization of a dielectric material in a low-frequency range, and is a resistance component corresponding to the skin effect and proximity effect of electrodes in a high-frequency range. As described above, impedance changes in accordance with frequency. Theoretically, when direct current (DC) is applied, the electrical double layer Cdl does not conduct electricity. When AC voltage is applied, the resistance value becomes zero as the frequency of the AC voltage increases. Therefore, at a high frequency (e.g., 100 Hz or higher), the combined resistance of the circuit is equal to the solution resistance Rsol. As the frequency increases (100 mHz to 100 Hz), the combined resistance includes the charge transfer resistance Rct and the electrical double layer Cdl in addition to the solution resistance Rsol. At a low frequency (lower than 100 mHz), the combined resistance of the circuit is the sum of the solution resistance Rsol and the charge transfer resistance Rct.

AC Impedance Method

Since the rechargeable battery 1 has properties as described above, the properties of the rechargeable battery 1 are measured by an AC impedance method. The AC impedance method is a method that applies voltage or current to the electrode system of the rechargeable battery as a frequency with very small amplitude is changed in a stepped manner to observe impedance spectrum of the rechargeable battery. The electrode system of the rechargeable battery includes, for example, the positive electrode 2 and the negative electrode 3.

The term "alternating current (AC)" refers to a current that periodically reverses direction in accordance with time. In the present embodiment, AC is a sine wave. However, AC is not limited to a sine wave and includes a waveform that periodically changes direction and magnitude. AC other than a sine wave is referred to as a non-sinusoidal alternating current and includes a square wave, a triangle wave, and a sawtooth wave. Further, the measurement may be conducted as the frequency is changed using a DC pulse wave such as a square wave, a triangle wave, or a sawtooth wave having a fixed cycle instead of using AC.

Nyquist Plot

Figure 4:
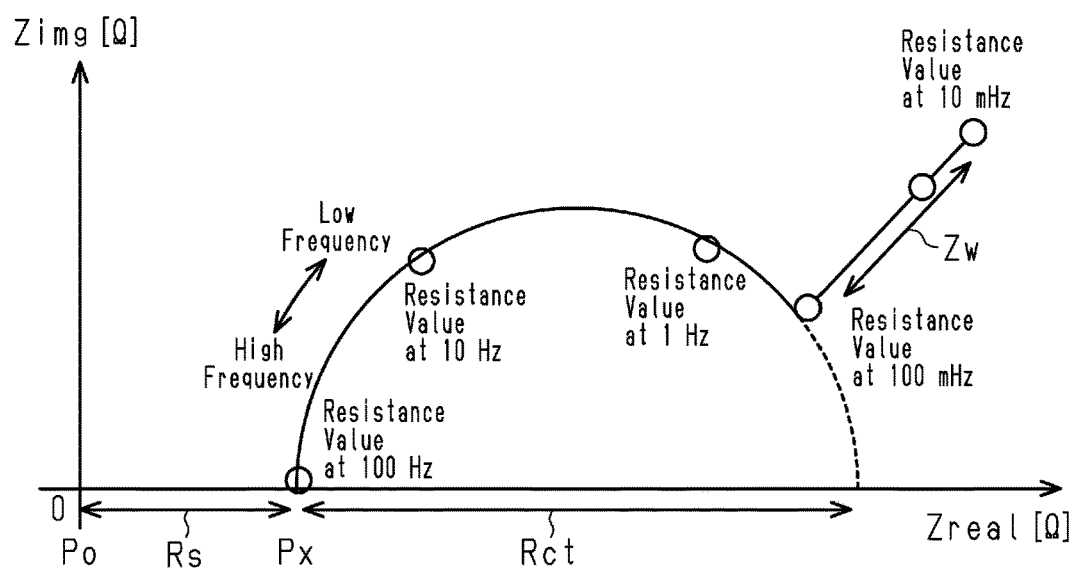
FIG. 4 is a graph showing a relationship between a Nyquist plot obtained by an AC impedance method and each resistance component.

FIG. 4 is a graph showing a relationship between a Nyquist plot obtained by the AC impedance method and each resistance component.

The analysis result of the rechargeable battery 1 obtained by the AC impedance method is output as, for example, a Nyquist plot. With a Nyquist plot, the properties of the rechargeable battery such as response speed of the electrodes, electrical conductivity of the electrolyte, and capacitance of the electrical double layer are measured from impedance and a phase difference.

The Nyquist plot has an imaginary value Zimg[Ω] of resistance on the vertical axis and a real value Zreal[Ω] of resistance on the horizontal axis. As the frequency with very small amplitude is changed from a high frequency in a stepped manner, voltage or current is applied to the electrode system of the rechargeable battery 1. As a result, a zero cross Px is located at a position shifted rightward from the lower left origin Po along the horizontal axis, and a graph extends upward from the zero cross Px and is shaped as an arc having its center on the horizontal axis. Then, the graph linearly extends radially outward from an upper right point.

Electron Transfer Resistance Rs

In the example of the present embodiment, the electron transfer resistance Rs is expressed by the distance from the origin Po to the zero cross Px. That is, the electron transfer resistance Rs is expressed by the real value Zreal[Ω] of resistance of the zero cross Px. This allows for analysis of resistance, for example, when electrons transfer in the electrolytic solution, the electrode poles, and the collector plates at a high frequency of 100 Hz or higher.

Reaction Resistance Rct

In the example of the present embodiment, at an intermediate frequency (from 100 Hz to 0.1 Hz), "reaction resistance Rct," that is, resistance when charge (ions) transfers, is analyzed from chemical reaction at the electrodes. The reaction resistance Rct is expressed by a graph extending from the zero cross Px and shaped as an arc having its center on the horizontal axis. When the performance of the electrodes has lowered, the arc-shaped graph has a larger radius.

Diffusion Resistance Zw

At a low frequency that is less than 0.1 Hz, "diffusion resistance Zw," that is, a resistance when charge in an active material diffuses, is observed.

Analysis in Nyquist Plot

Figure 5:
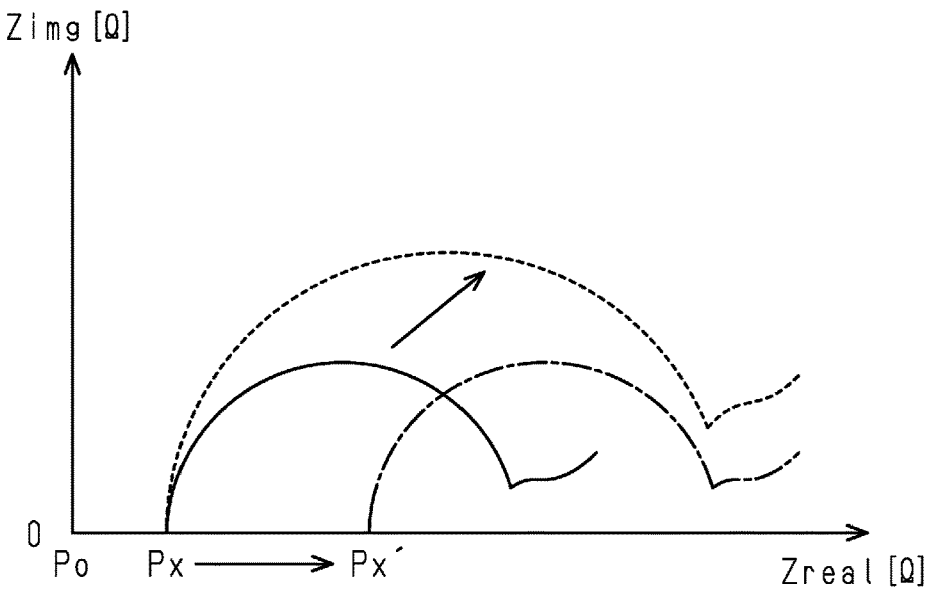
FIG. 5 is a graph showing a relationship between a Nyquist plot and deterioration of a rechargeable battery.

FIG. 5 is a graph showing a relationship between a Nyquist plot and deterioration of the rechargeable battery 1. The solid line graph is a Nyquist plot of the rechargeable battery 1 that has not deteriorated and is in the initial state. When the resistance is increased as electrons transfer in the electrolytic solution, the electrode poles, and the collector plates, the zero cross Px shifts rightward along the horizontal axis to a zero cross Px'. Accordingly, the arc-shaped portion shifts rightward to a position indicated by the single-dashed line. That is, the real value Zreal of the electron transfer resistance Rs is increased.

When the electrolyte property has deteriorated, the radius of the arc-shaped portion in the Nyquist plot of the rechargeable battery 1 that has not deteriorated and is in the initial state is increased as indicated by the broken line graph.

Rechargeable Battery State Determining Device 10

Figure 6:
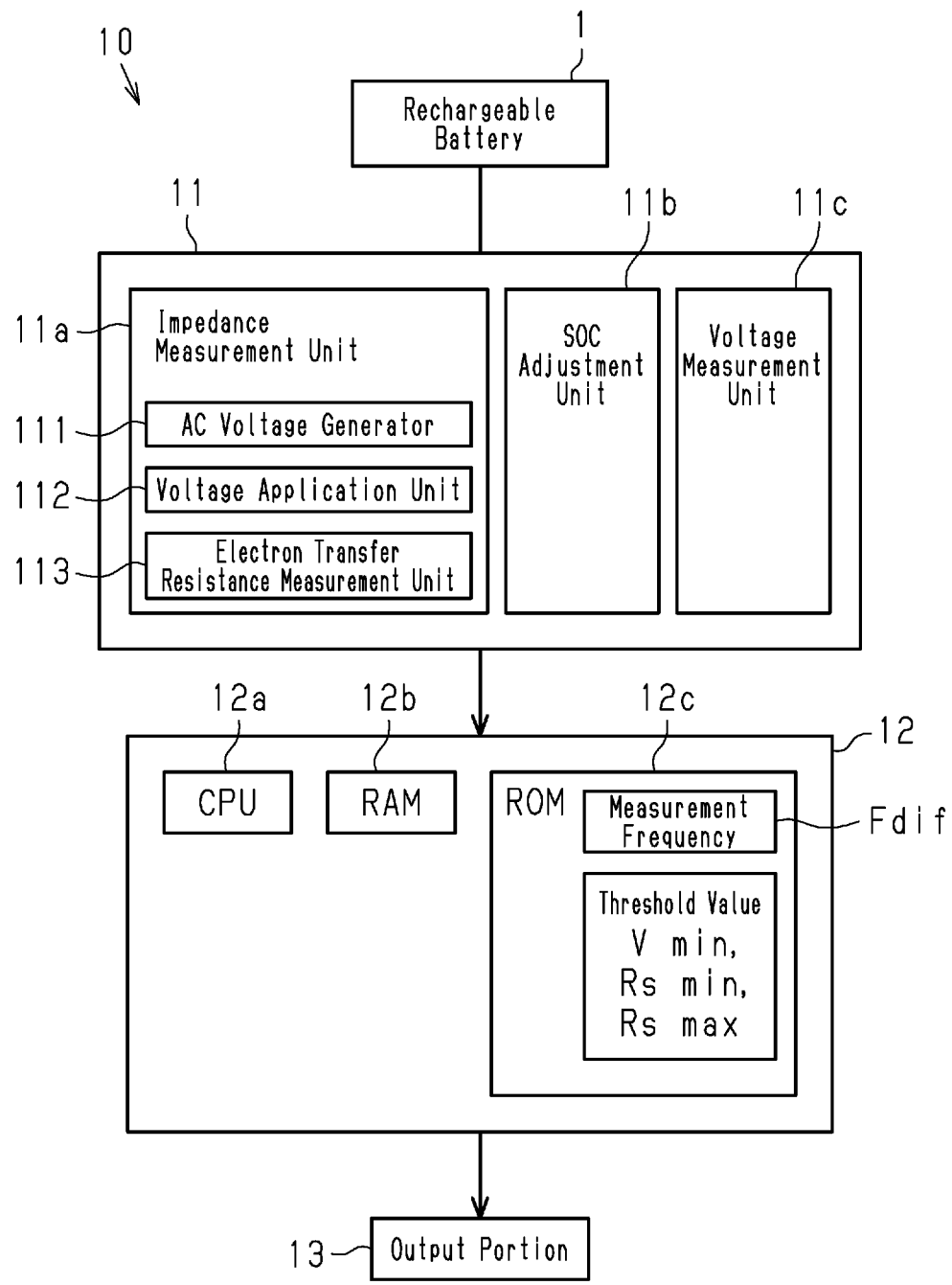
FIG. 6 is a block diagram of a rechargeable battery state determining device.

FIG. 6 is a block diagram of a rechargeable battery state determining device. As shown in FIG. 6, the rechargeable battery state determining device 10 includes a measuring device 11, a determining device 12 that is a controller, and an output portion 13 and is connected to the rechargeable battery 1.

Rechargeable Battery 1

The rechargeable battery 1 of the present embodiment is a battery module including battery cells. Such battery modules are combined to form a battery stack. Further, the battery stack and an ECU form a battery pack mounted on a vehicle or the like. In the present embodiment, the state of the rechargeable battery 1 is determined for each battery module, and the measuring device 11 is connected to each battery module. Hence, in this specification, the rechargeable battery 1 refers to each battery module.

Measuring Device 11

The measuring device 11 includes an impedance measurement unit 11a, a state of charge (SOC) adjustment unit 11b, and a voltage measurement unit 11c.

Impedance Measurement Unit 11a

The impedance measurement unit 11a is configured to be an AC impedance measuring device configured to apply voltage or current to the rechargeable battery 1, which is the subject of determination, to measure AC impedance of the rechargeable battery 1. The impedance measurement unit 11a includes an AC voltage generator 111, a voltage application unit 112, and an electron transfer resistance measurement unit 113.

AC Voltage Generator 111

The AC voltage generator 111 is configured to change the frequency using an inverter to generate voltage or current that is changed in a stepped manner from DC to a high frequency of 100 kHz or higher with very small amplitude.

Voltage Application Unit 112

The voltage application unit 112 applies the generated voltage or current to the two electrodes of the battery module of the rechargeable battery 1.

Electron Transfer Resistance Measurement Unit 113

To ensure that the electron transfer resistance Rs is measured at the zero cross Px, the electron transfer resistance measurement unit 113 measures the electron transfer resistance Rs of the rechargeable battery 1 when a high frequency voltage or current of 1 kHz or higher is applied to the electrode system of the battery module of the rechargeable battery 1.

SOC Adjustment Unit 11b

The rechargeable battery 1 does not need to be fully charged to perform the determination. Rather, when the rechargeable battery 1 is likely to form a micro-short circuit, the AC impedance of the rechargeable battery 1 is changed by a greater amount as the SOC of the rechargeable battery 1 becomes closer to 0%. The impedance measurement unit 11a measures the AC impedance of the rechargeable battery 1 when the SOC is less than or equal to 20%. This improves the accuracy of detecting a micro-short circuit. When the impedance measurement unit 11a measures the AC impedance, the SOC adjustment unit 11b adjusts the SOC of the rechargeable battery 1 to 20% or less, which is suitable for the AC impedance measurement.

Voltage Measurement Unit 11c

The voltage measurement unit 11c measures the circuit voltage OCV of battery modules to detect a battery module in which the voltage is decreased by a micro-short circuit.

Determining Device 12

The determining device 12 corresponds to a controller configured to be a known computer including a CPU 12a, a RAM 12b, and a ROM 12c. The ROM 12c stores a program or commands used to determine a battery state.

The ROM 12c of the determining device 12 stores a measurement frequency Fdif that is set through tests or the like, a lower limit voltage threshold value Vmin, an upper limit threshold value Rsmax, and a lower limit threshold value Rsmin for a battery module that is subject to the determination. The measurement frequency Fdif, the lower limit voltage threshold value Vmin, the upper limit threshold value Rsmax, and the lower limit threshold value Rsmin vary depending on the type of battery such as a lithium-ion rechargeable battery and a nickel-metal hydride rechargeable battery, and also vary when batteries of the same type differ in the number of cells or the capacity. When batteries that are subject to the determination vary in the type or configuration, the CPU 12a sets the measurement frequency Fdif, the lower limit voltage threshold value Vmin, the upper limit threshold value Rsmax, and the lower limit threshold value Rsmin in accordance with the subject of determination.

The AC impedance Z of the battery module is expressed in a complex number as Z=Zreal+jZimg where a real axis component Zreal and an imaginary axis component Zimg are vector components and j is an imaginary unit, and is output as a Nyquist plot.

Lower Limit Voltage Threshold Value Vmin

When a micro-short circuit is formed in the rechargeable battery 1, the rechargeable battery 1 performs self-discharge even when the rechargeable battery 1 is not used. As a result, the circuit voltage OCV is decreased. When such a state continues, the circuit voltage OCV is decreased to a level that is not reached under a normal use condition. In a bad case, the rechargeable battery 1 may be overdischarged. The lower limit voltage threshold value Vmin is used as the reference for determining whether the rechargeable battery 1 is performing such self-discharge. More specifically, the CPU 12a compares the circuit voltage OCV, which is measured by the voltage measurement unit 11c, with the predetermined lower limit voltage threshold value Vmin. If the circuit voltage OCV is greater than or equal to the lower limit voltage threshold value Vmin, the CPU 12a determines that the rechargeable battery 1 is a conforming piece based on the assumption that self-discharge is less than the assumed reference. If the circuit voltage OCV is less than the lower limit voltage threshold value Vmin, the CPU 12a determines that the rechargeable battery 1 is a non-conforming piece based on the assumption that self-discharge is greater than the assumed reference.

Upper Limit Threshold Value Rsmax

To determine whether the amount of the electrolytic solution contained in the separator of the rechargeable battery 1 is sufficient, when the electron transfer resistance Rs is large, it is assumed that the contained amount of the electrolytic solution is decreased by a large amount correlated with the electron transfer resistance Rs.

Figure 8:
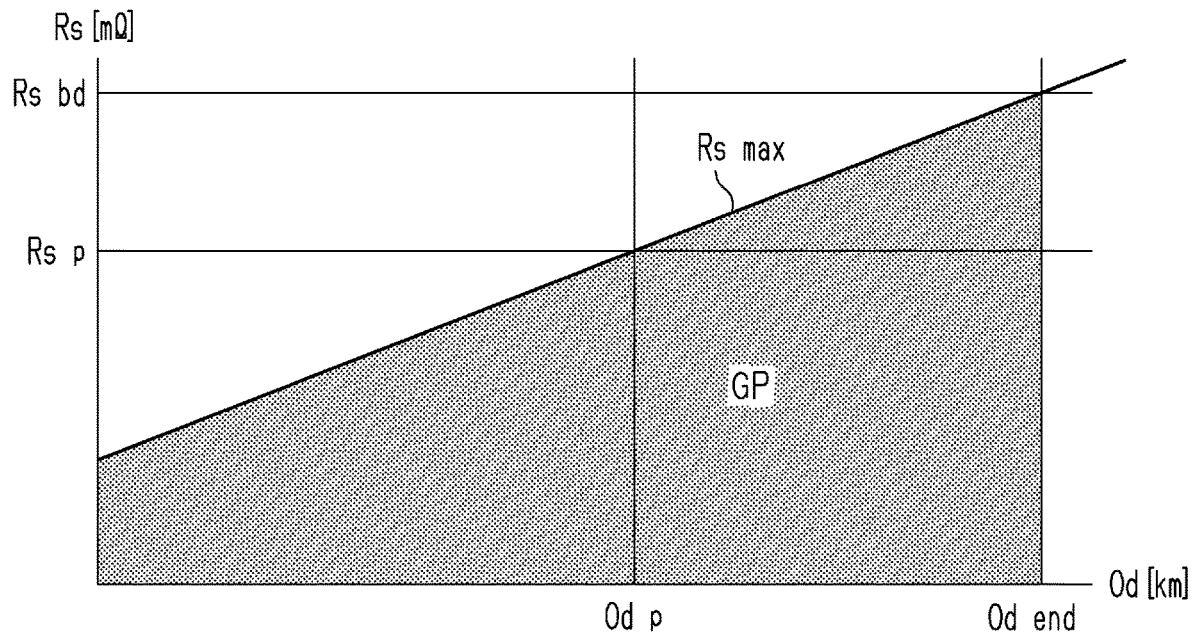
FIG. 8 is a graph showing behavior of electron transfer resistance Rs when a solution content is deceased due to moisture permeation in accordance with a travel distance.

FIG. 8 is a graph showing behavior of Rs[mΩ] when the contained amount of the electrolytic solution is decreased due to moisture permeation in accordance with travel distance Od[km]. The horizontal borderline Rsbd indicated by the solid line shows the electron transfer resistance Rs when the amount of the electrolytic solution contained in the rechargeable battery 1 is sufficient. That is, the borderline Rsbd shown in FIG. 8 is a borderline between the electron transfer resistance Rs when the rechargeable battery 1 contains a sufficient amount of the electrolytic solution and the electron transfer resistance Rs when the rechargeable battery 1 does not contain a sufficient amount of the electrolytic solution. For example, in a nickel metal hydride rechargeable battery, the contained amount of the electrolytic solution decreases as permeation from a resin battery case progresses. Also, in other batteries, it is considered that the contained amount of the electrolytic solution decreases in accordance with the travel distance Od of the rechargeable battery 1 such as a decrease in the electrolytic solution caused by reaction with the positive electrode or the negative electrode. When the contained amount of the electrolytic solution decreases in accordance with the travel distance Od, the electron transfer resistance Rs increases. When the electron transfer resistance Rs exceeds the borderline Rsbd, it indicates that the contained amount of the electrolytic solution is abnormally small. The electron transfer resistance Rs needs to be configured not to exceed the borderline Rsbd at a travel distance Odend, that is, an expected life.

A graph of the upper limit threshold value Rsmax is used as a reference of a threshold value for determining whether the expected remaining life is completed. More specifically, the CPU 12a compares the electron transfer resistance Rs, which is measured by the impedance measurement unit 11a, with a corresponding threshold value Rsp that is predetermined in correspondence with the travel distance Od, more specifically, a corresponding threshold value Rsp that is predetermined in correspondence with the travel distance Od in the graph of the upper limit threshold value Rsmax. That is, the upper limit threshold value Rsmax includes the corresponding threshold value Rsp that is predetermined in correspondence with each travel distance Od. When the electron transfer resistance Rs is less than or equal to the corresponding threshold value Rsp, the CPU 12a determines that a sufficient amount of the electrolytic solution will be ensured for the expected remaining life and determines that the rechargeable battery 1 is a conforming piece GP. When the electron transfer resistance Rs is greater than the corresponding threshold value Rsp, the CPU 12a determines that a sufficient amount of the electrolytic solution will not be ensured for the expected remaining life and determines that the rechargeable battery 1 is a non-conforming piece NGP.

Lower Limit Threshold Value Rsmin

To determine whether the inter-electrode distance D is satisfactory, when the electron transfer resistance Rs is small, it is assumed that the inter-electrode distance D has narrowed in correlation with the electron transfer resistance Rs.

Figure 9:
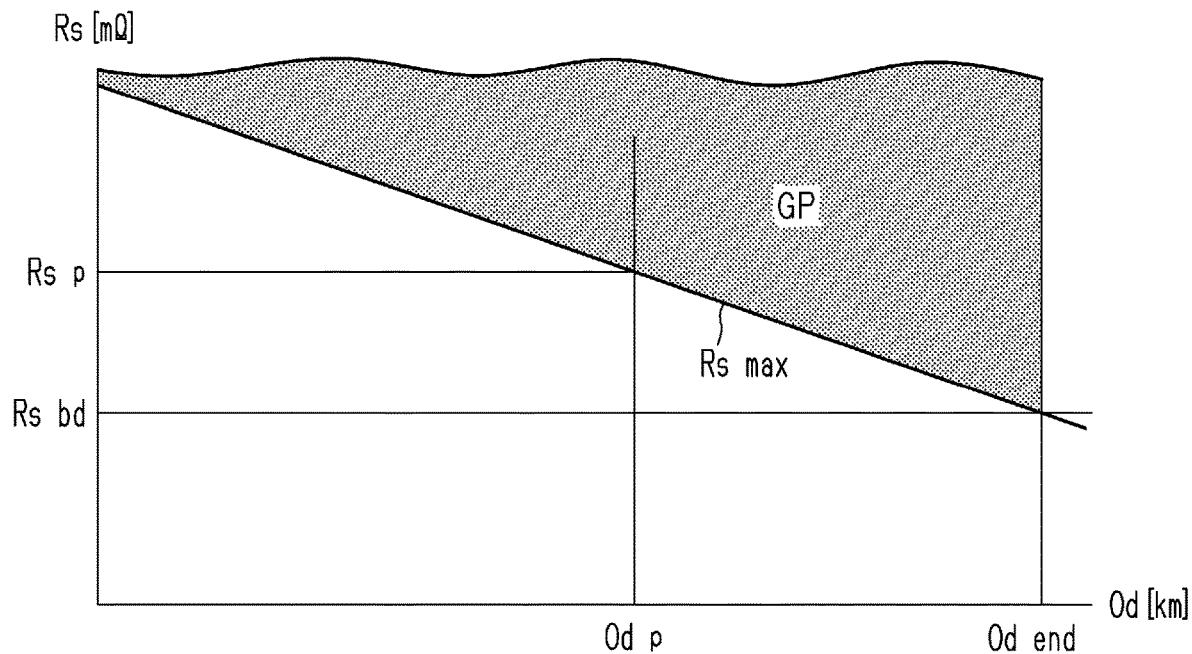
FIG. 9 is a graph showing behavior of electron transfer resistance Rs when the distance between a positive electrode and a negative electrode is shortened by expansion of the positive electrode in accordance with a travel distance.

FIG. 9 is a graph showing the behavior of the electron transfer resistance Rs[mΩ] when the inter-electrode distance D is decreased by, for example, expansion of the positive electrode in accordance with the travel distance Od[km]. The horizontal borderline Rsbd indicated by the solid line shows the electron transfer resistance Rs when the rechargeable battery 1 has an adequate inter-electrode distance D. That is, the borderline Rsbd is a borderline between the electron transfer resistance Rs when the rechargeable battery 1 has an adequate inter-electrode distance D and the electron transfer resistance Rs when the rechargeable battery 1 does not have an adequate inter-electrode distance D. It is considered that expansion of the positive electrode, which decreases the inter-electrode distance D, progresses in accordance with the travel distance Od of the rechargeable battery 1. When the inter-electrode distance D decreases in accordance with the travel distance Od, the electron transfer resistance Rs decreases. When the electron transfer resistance Rs becomes less than the borderline Rsbd, it indicates that the inter-electrode distance D is abnormally short. The electron transfer resistance Rs needs to be configured not to become less than the borderline Rsbd at a travel distance Odend, that is, an expected life.

A graph of the lower limit threshold value Rsmin is used as a reference of a threshold value for determining whether the expected remaining life is completed. More specifically, the CPU 12a compares the electron transfer resistance Rs, which is measured by the impedance measurement unit 11a, with a corresponding threshold value Rsp that is predetermined in correspondence with the travel distance Od, more specifically, a corresponding threshold value Rsp that is predetermined in correspondence with the travel distance Od in the graph of the lower limit threshold value Rsmin. That is, the lower limit threshold value Rsmin includes the corresponding threshold value Rsp that is predetermined in correspondence with each travel distance Od. When the electron transfer resistance Rs is greater than or equal to the corresponding threshold value Rsp, the CPU 12a determines that a sufficient inter-electrode distance D will be ensured for the expected remaining life and determines that the rechargeable battery 1 is a conforming piece GP. When the electron transfer resistance Rs is less than the corresponding threshold value Rsp, the CPU 12a determines that a sufficient inter-electrode distance D will not be ensured for the expected remaining life and determines that the rechargeable battery 1 is a non-conforming piece NGP.

Setting Process of Lower Limit Threshold Value Rsmin

Figure 10:
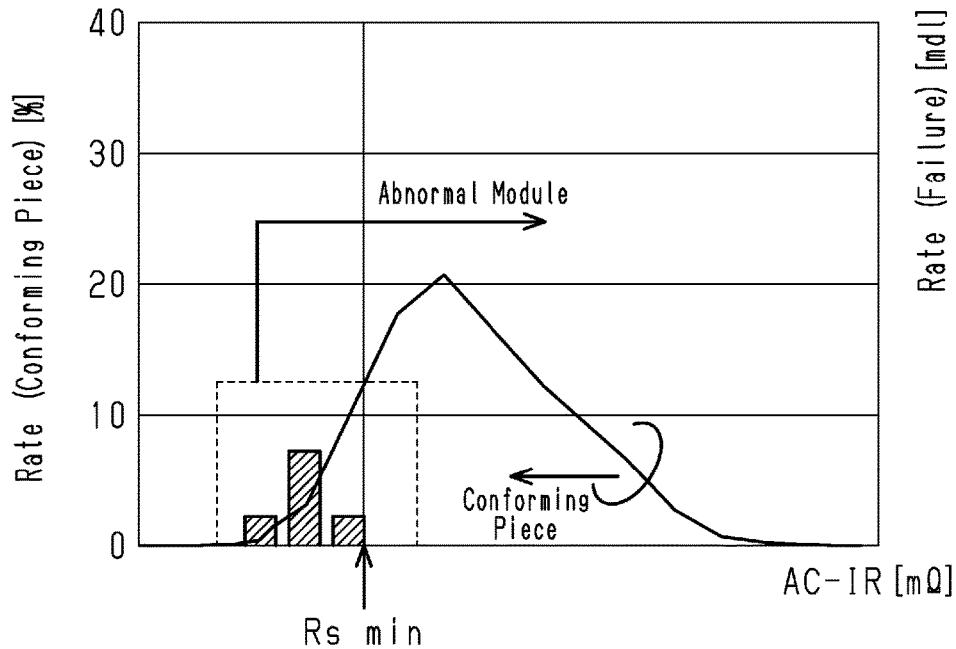
FIG. 10 is a graph showing a relationship in alternating current insulation resistance (AC-IR) distribution between non-defective products and products having a micro-short circuit in the market.

The setting of the lower limit threshold value Rsmin will be described. FIG. 10 is a graph showing a relationship in AC-IR distribution between non-defective products and products having a micro-short circuit in the market. For a lower limit of detection used as a reference in an analysis value evaluation, it is important to determine a method detection limit (MDL). In the present embodiment, the rate of abnormal modules to conforming pieces is adequate, and it is determined that the detection error is small. The lower limit threshold value Rsmin obtained from presence of the abnormal modules is, for example, 4.0 to 7.0 mΩ or greater. It is preferred that the temperature at which the lower limit threshold value Rsmin is determined is the same as that at which an actual inspection is conducted. When different temperatures are used, correction may be made by determining in advance a temperature changing tendency of resistance.

Operation of Determining Device 12

The determining device 12, which includes the configuration and data as described above, functions as the following means.

Self-Discharge Determination Means

The CPU 12a of the determining device 12 compares the circuit voltage OCV of the rechargeable battery 1, which is obtained by the voltage measurement unit 11c of the measuring device 11, with the predetermined lower limit voltage threshold value Vmin. When the circuit voltage OCV of the rechargeable battery 1 is greater than or equal to the predetermined lower limit voltage threshold value Vmin, it is determined that the rechargeable battery 1 is a conforming piece GP.

Electrolytic Solution Determination Means

The CPU 12a of the determining device 12 compares the electron transfer resistance Rs with the predetermined upper limit threshold value Rsmax. When the electron transfer resistance Rs is less than the predetermined upper limit threshold value Rsmax, it is determined that the electrolytic solution is satisfactory and that the rechargeable battery 1 is a conforming piece.

Inter-Electrode Distance Determination Means

The CPU 12a of the determining device 12 compares the electron transfer resistance Rs with the predetermined lower limit threshold value Rsmin. When the electron transfer resistance Rs is greater than or equal to the predetermined lower limit threshold value Rsmin, it is determined that the inter-electrode distance is satisfactory and that the rechargeable battery 1 is a conforming piece.

Output Portion 13

The CPU 12a of the determining device 12 transmits the determination results to the output portion 13, which is, for example, a display of a car navigation system, a printer, or a wireless transmitter.

Operation of Present Embodiment

Flowchart for Determining Battery having Micro-Short Circuit

Figure 7:
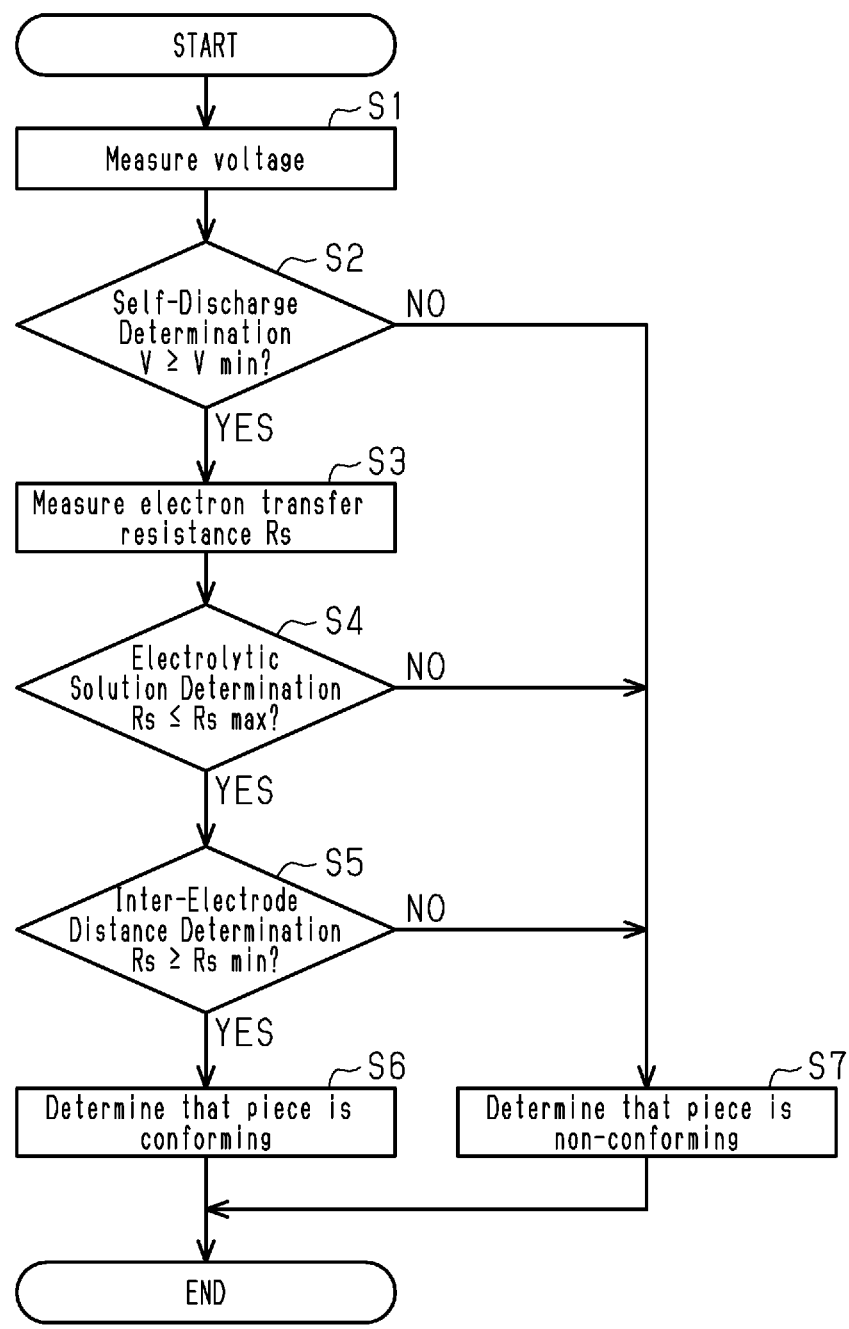
FIG. 7 is a flowchart of a rechargeable battery state determination method.

FIG. 7 is a flowchart of a process for determining the state of the rechargeable battery 1. The procedure of the process for determining the state of the rechargeable battery 1 will be described along the flowchart.

Starting of Rechargeable Battery State Determining Process

The rechargeable battery state determining process is started (start). To determine the state of the rechargeable battery 1, the rechargeable battery 1 is connected to the rechargeable battery state determining device 10. In this case, the rechargeable battery 1 is removed and collected from a vehicle and is connected to the rechargeable battery state determining device 10 located in the factory. Alternatively, the rechargeable battery 1 is connected to the rechargeable battery state determining device 10 that is mounted on a vehicle 100 so that the rechargeable battery state determining device 10 is constantly connectable to the rechargeable battery 1. In each case, the rechargeable battery state determining process is started by connecting the rechargeable battery state determining device 10 to the battery module of the rechargeable battery 1.

Self-Discharge Determination

The circuit voltage OCV of the battery module of the rechargeable battery 1 is measured (S1). The measured circuit voltage OCV is compared with the lower limit voltage threshold value Vmin (S2). If the circuit voltage OCV is greater than or equal to the lower limit voltage threshold value Vmin (S2: YES), it is determined the rechargeable battery 1 is a conforming piece GP regarding self-discharge. The process proceeds to a step that measures the electron transfer resistance Rs (S3).

If the circuit voltage OCV is less than the lower limit voltage threshold value Vmin (S2: NO), it is determined that self-discharge is large and that the rechargeable battery 1 is a non-conforming piece NGP. Therefore, the rechargeable battery 1 is not used as a component of a battery pack (S7). The procedure of the rechargeable battery state determining process ends (end).

Electrolytic Solution Determination

If it is determined in the self-discharge determination (S2) that the rechargeable battery 1 is a conforming piece GP (S2: YES), the electron transfer resistance Rs is measured in the step measuring the electron transfer resistance Rs (S3). The measured electron transfer resistance Rs is compared with the upper limit threshold value Rsmax (S4). If the electron transfer resistance Rs is less than or equal to the upper limit threshold value Rsmax (S4: YES), it is assumed that the contained amount of the electrolytic solution is sufficient and it is determined that the rechargeable battery 1 is a conforming piece GP.

When the measured electron transfer resistance Rs is compared with the upper limit threshold value Rsmax (S4), if the electron transfer resistance Rs is greater than the upper limit threshold value Rsmax (S4: NO), it is assumed that the contained amount of the electrolytic solution is insufficient and is determined that the rechargeable battery 1 is a non-conforming piece NGP. The rechargeable battery 1 is not used as a component of a battery pack (S7). The procedure of the rechargeable battery state determining process ends (end).

Inter-Electrode Distance Determination

If it is determined in the electrolytic solution determination that the rechargeable battery 1 is a conforming piece GP (S4: YES), the measured electron transfer resistance Rs is compared with the lower limit threshold value Rsmin (S5). If the electron transfer resistance Rs is greater than or equal to the lower limit threshold value Rsmin (S5: YES), it is assumed that the inter-electrode distance D is sufficiently maintained and is determined that the rechargeable battery 1 is a conforming piece GP.

When the measured electron transfer resistance Rs is compared with the lower limit threshold value Rsmin (S5), if the electron transfer resistance Rs is less than the upper limit threshold value Rsmax (S5: NO), it is assumed that the inter-electrode distance D is not sufficiently maintained. It is determined that the rechargeable battery 1 is a non-conforming piece NGP, and the rechargeable battery 1 is not used as a component of a battery pack (S7). The procedure of the rechargeable battery state determining process ends (end).

Determination of Rechargeable Battery 1

If it is determined in the inter-electrode distance determination that the rechargeable battery 1 is a conforming piece GP (S5: YES), the rechargeable battery 1 is already determined to be a conforming piece GP in the self-discharge determination (S2) and the electrolytic solution determination (S4). Thus, it is ultimately determined that the rechargeable battery 1 is a conforming piece GP, and the battery module of the rechargeable battery 1 is used as a component that reforms a battery pack (S6). The procedure of the rechargeable battery state determining process ends (end).

Effects of First Embodiment (1) The rechargeable battery state determining process of the present embodiment increases the accuracy of estimating a remaining life related to a micro-short circuit without breaking the battery.

(2) The state of each battery module is accurately determined. When reforming a rechargeable battery using used modules, an assembled battery includes only battery modules having a good quality. This improves the quality of a battery pack.

(3) A micro-short circuit state is determined by comparing the circuit voltage OCV with the lower limit voltage threshold value Vmin. The electron transfer resistance Rs is determined by comparing the lower limit threshold value Rsmin with the upper limit threshold value Rsmax. This allows for detection from various aspects and thoroughly detects a rechargeable battery performing self-discharge, a rechargeable battery that is likely to form a micro-short circuit in the future due to containing an insufficient amount of the electrolytic solution, and a rechargeable battery that is likely to form a micro-short circuit due to a decrease in the inter-electrode distance D.

Second Embodiment

In the first embodiment, the rechargeable battery 1 is dismounted from the vehicle and connected to the rechargeable battery state determining device 10 to execute the determination. In the second example, the rechargeable battery state determining device 10 is mounted on the vehicle 100, and the rechargeable battery state determining device 10 is connected to the rechargeable battery 1 as necessary. With this configuration, the state of the rechargeable battery is determined while the rechargeable battery is mounted on the vehicle.

Configuration of Vehicle 100 on which Rechargeable Battery 1 is Mounted

Figure 11:
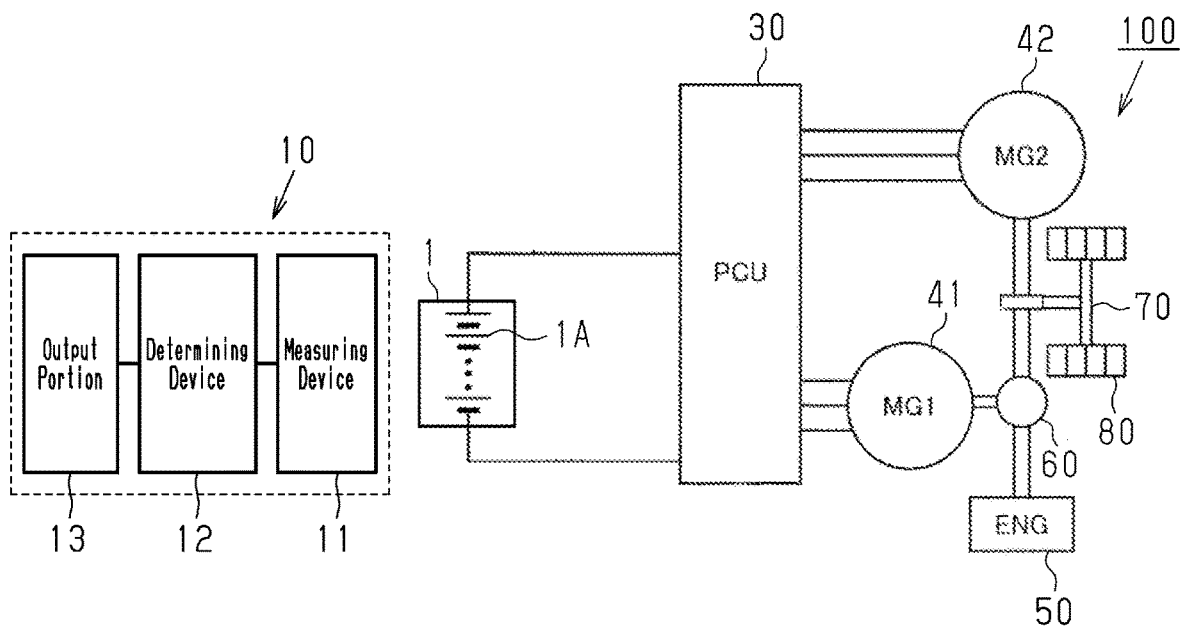
FIG. 11 is a block diagram showing the configuration of a vehicle including a rechargeable battery state determining device.

FIG. 11 is a schematic diagram showing the configuration of the vehicle 100 on which the rechargeable battery state determining device 10 of the present embodiment is mounted. The vehicle 100 on which the rechargeable battery 1 of the present embodiment is mounted will be briefly described with reference to FIG. 11. The vehicle 100 is a hybrid vehicle. The vehicle 100 includes the rechargeable battery state determining device 10, a power control unit 30 (PCU), motor generators 41 and 42, an engine 50, a power-split device 60, a drive shaft 70, and drive wheels 80.

The PCU 30 is configured to be a computer including a CPU, a RAM, a ROM and includes a voltage sensor, a current sensor, and a temperature sensor. The voltage sensor detects a cell voltage VB. The current sensor detects current IB that is input to and output from the rechargeable battery 1. The temperature sensor detects a cell temperature TB of each block. Each sensor outputs a signal indicating the detection result to the CPU of the PCU 30.

The vehicle 100 is supplied with drive power from the rechargeable battery 1 and charges the rechargeable battery 1 with regenerated power using the motor generators 41 and 42, which are coupled to the engine 50. The rechargeable battery state determining device 10 is independent from the drive system and determines the state of the rechargeable battery 1 at any time.

Effect of Second Embodiment (4) The rechargeable battery state determining device has a simple configuration and thus is mountable on a vehicle. The state of a rechargeable battery that is on-board is determined even while the vehicle is in operation.

Modified Examples

The embodiments may be modified as follows.

In the embodiments, the flowchart of the process for determining the state of the rechargeable battery 1 shown in FIG. 7 is an example. The order and contents are not limited to those described in the embodiments. Unless specifically described, the flowchart shown in FIG. 7 may be executed in a similar or different order and may include an additional or alternative step. In an example, in the flowchart shown in FIG. 7, the self-discharge determination, the electrolytic solution determination, and the inter-electrode distance determination may be executed in a different order, and one of the self-discharge determination, the electrolytic solution determination, and the inter-electrode distance determination may be omitted.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A rechargeable battery state determination method that determines whether a rechargeable battery is in a micro-short-circuit-prone state, which is a state that is highly likely to form a micro-short circuit, the rechargeable battery state determination method, comprising:

measuring an electron transfer resistance of the rechargeable battery by applying a voltage or current having a predetermined or higher frequency to an electrode system of the rechargeable battery, wherein:
the electron transfer resistance of the rechargeable battery is correlated with an inter-electrode distance of the rechargeable battery and an amount of an electrolytic solution contained in a separator of the rechargeable battery; and
the measuring an electron transfer resistance of the rechargeable battery includes:
outputting a Nyquist plot by applying a voltage or current to the electrode system of the rechargeable battery as a frequency with very small amplitude is changed in a stepped manner to measure impedance spectrum of the rechargeable battery using an alternating current impedance method; and
obtaining a real value of a zero cross expressing the electron transfer resistance of the rechargeable battery from the outputted Nyquist plot;
determining whether the inter-electrode distance is satisfactory based on a comparison of the measured electron transfer resistance of the rechargeable battery with a predetermined lower limit threshold value, the determining whether an inter-electrode distance is satisfactory including determining that the inter-electrode distance is satisfactory when the measured electron transfer resistance of the rechargeable battery is greater than or equal to the lower limit threshold value;
determining whether the amount of the electrolytic solution contained in the separator is satisfactory based on a comparison of the measured electron transfer resistance of the rechargeable battery with a predetermined upper limit threshold value, the determining whether the amount of the electrolytic solution contained in the separator is satisfactory includes determining that the amount of the electrolytic solution contained in the separator is satisfactory when the measured electron transfer resistance of the rechargeable battery is less than the predetermined upper limit threshold value; and
determining that the rechargeable battery is a conforming piece when the inter-electrode distance and the amount of the electrolytic solution contained in the separator are satisfactory.

2. The rechargeable battery state determination method according to claim 1, wherein the voltage or current applied to measure the electron transfer resistance of the rechargeable battery has a sine wave or a non-sinusoidal wave including a square wave, a triangle wave, and a sawtooth wave.

3. The rechargeable battery state determination method according to claim 1, further comprising:
measuring a circuit voltage of the rechargeable battery; and
determining whether the micro-short circuit is formed base on a comparison of the measured circuit voltage of the rechargeable battery with a predetermined lower limit voltage threshold value, wherein
the determining whether the micro-short circuit is formed includes determining that the micro-short circuit is not formed when the measured circuit voltage of the rechargeable battery is greater than or equal to the predetermined lower limit voltage threshold value, and
the determining that the rechargeable battery is a conforming piece further includes determining that the rechargeable battery is a conforming piece when the micro-short circuit is not formed.

4. The rechargeable battery state determination method according to claim 1, further comprising:
measuring a circuit voltage of the rechargeable battery; and
determining whether the micro-short circuit is formed base on a comparison of the measured circuit voltage of the rechargeable battery with a predetermined lower limit voltage threshold value, wherein the determining whether the micro-short circuit is formed includes determining that the micro-short circuit is not formed when the measured circuit voltage of the rechargeable battery is greater than or equal to the predetermined lower limit voltage threshold value, and the determining that the rechargeable battery is a conforming piece further includes determining that the rechargeable battery is a conforming piece when the micro-short circuit is not formed.

\* \* \* \* \*